United States Patent [19]
van den Berg et al.

[11] Patent Number: 5,516,588
[45] Date of Patent: May 14, 1996

[54] COMPOSITE BODY, ITS USE AND A PROCESS FOR ITS PRODUCTION

[75] Inventors: Hendrikus van den Berg, Venlo-Blerick, Netherlands; Ralf Tabersky, Bottrop; Udo König, Essen, both of Germany; Norbert Reiter, Mettmann, Australia

[73] Assignee: Widia GmbH, Essen, Germany

[21] Appl. No.: 122,511

[22] PCT Filed: Mar. 27, 1992

[86] PCT No.: PCT/DE92/00249

§ 371 Date: Sep. 24, 1993

§ 102(e) Date: Sep. 24, 1993

[87] PCT Pub. No.: WO90/06380

PCT Pub. Date: Jun. 14, 1990

[30] Foreign Application Priority Data

Mar. 27, 1991 [DE] Germany .......................... 41 10 005.9
Mar. 27, 1991 [DE] Germany .......................... 41 10 006.9

[51] Int. Cl.$^6$ ............................................. B32B 15/04
[52] U.S. Cl. ................. 428/469; 428/220; 428/472; 428/698; 428/699; 428/700; 428/701; 428/702; 427/8; 427/10; 427/564; 427/573; 427/576; 427/577; 51/295; 51/309
[58] Field of Search ............................. 428/469, 472, 428/696, 698, 699, 700, 701, 702, 220; 427/249, 255, 8, 10, 564, 573, 576, 577; 51/295, 309

[56] References Cited

U.S. PATENT DOCUMENTS

| 4,463,033 | 7/1984 | Kikuchi | 427/255.3 |
|---|---|---|---|
| 5,137,774 | 8/1992 | Ruppi | 428/702 |
| 5,162,147 | 11/1992 | Ruppi | 428/702 |
| 5,250,367 | 10/1993 | Santhanam | 428/702 |
| 5,310,607 | 5/1994 | Schulz | 428/702 |

FOREIGN PATENT DOCUMENTS

| 0143889 | 8/1984 | European Pat. Off. . |
|---|---|---|
| 0162656 | 11/1985 | European Pat. Off. . |
| 0408535A1 | 1/1991 | European Pat. Off. . |
| 2144824 | 2/1973 | France . |
| 2225135 | 11/1972 | Germany . |
| 2253745 | 11/1972 | Germany . |
| 155907 | 7/1982 | Germany . |
| 3841730A1 | 6/1990 | Germany . |
| 43222392 | 6/1972 | U.S.S.R. . |

OTHER PUBLICATIONS

JP Patent Abstracts of Japan 63–195268 A, Dec. 14, 1988, vol. 12, No. 4

JP Abstracts of Japan 1–180980 A, Oct. 20, 1989, vol. 13, No. 466.

*Primary Examiner*—Ellis P. Robinson
*Assistant Examiner*—Timothy M. Speer
*Attorney, Agent, or Firm*—Herbert Dubno; Jonathan Myers

[57] ABSTRACT

A composite body, especially for use as a cutting tool, for the lining of combustion chambers or for movable parts intended to have low wear which has a substrate of hard metal, steel, cermet or nickel or cobalt alloy. The substrate is provided with at least one fine-crystalline alpha-$Al_2O_3$ layer deposited by plasma activated CVD at 400° to 750° C. With plasma activation by pulsed direct voltage with the substrate connected as the cathode.

22 Claims, 9 Drawing Sheets

FIG. 4a
$v_c = 315$ m/min  $\quad$ 42CrMO4V
$a_p = 15$ mm  $\quad$ $R_m = 840$ N/mm$^2$
$a_e = 120$ mm
$f_z = 0.25$ mm/Z
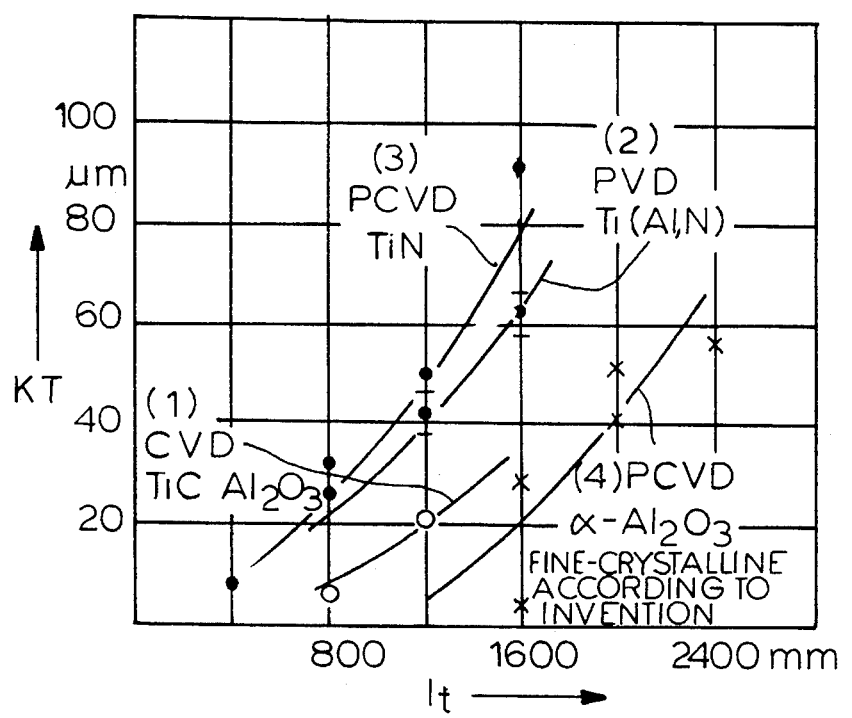
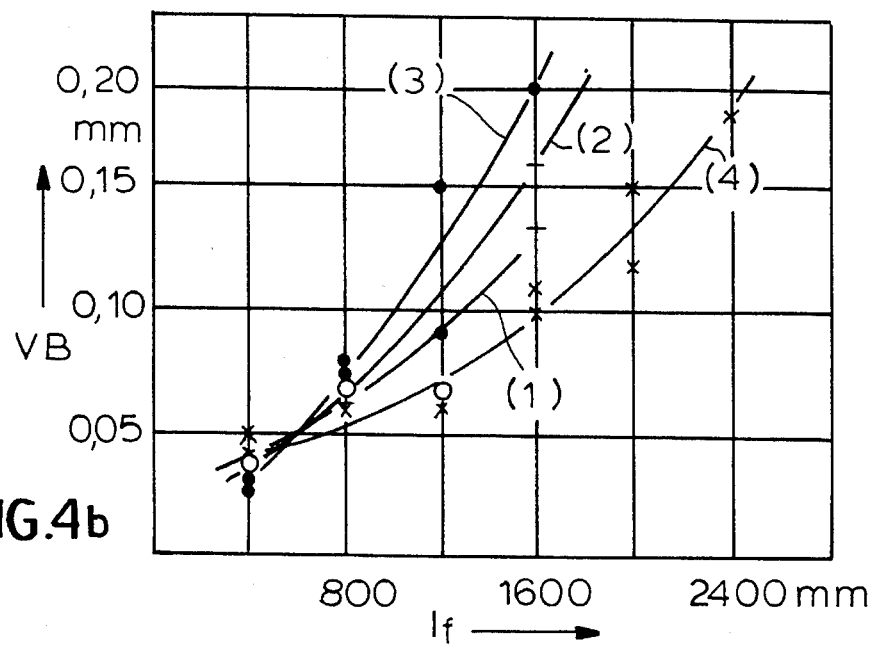
FIG. 4b

COMPOSITE BODY, ITS USE AND A PROCESS FOR ITS PRODUCTION

CROSS REFERENCE TO RELATED APPLICATIONS

This application is a national phase of PCT/DE 92/00249 filed 27 Mar. 1992 and based, in turn, on German national application P 41 10 006.9 and P 41 10 005.0 filed 27 Mar. 1991 under the International Convention.

FIELD OF THE INVENTION

The invention relates to a composite body of a hard metal, steel or cermet substrate body, or a substrate body of nickel or a cobalt-based alloy and one or more surface layers of which at least one, preferably the outer layer, consists of $\alpha$-$Al_2O_3$. The invention also relates to the use of this composite body and to a process for its production.

BACKGROUND OF THE INVENTION

DE 22 33 700 C2 provides hard metal substrate bodies consisting of a mixture of at least one metal serving as a bonding agent and at least one metal carbide with high hardness with a coating of aluminum oxide or zirconium oxide. The substrate body can consist, particularly of tungsten, titanium, tantalum or niobium carbide or of a composite carbide of tantalum and niobium, whereby for instance the metals cobalt, iron or nickel serve as bonding agent. In the literature hard metals based on titanium carbide or titanium carbonitride are frequently called cermets, which should also be understood as substrate materials which are combinations of a hard metal with a ceramic, i.e. nonmetallic components. According to DE 22 33 700 C2, the mentioned layers of $\alpha$-aluminum oxide are applied by using a CVD process at a substrate temperature of 1000° C.

Correspondingly, the same is valid for hard metal bodies. DE 22 53 745 A1 describes a sintered hard metal substrate body, an intermediate layer of titanium carbide and an outer layer of aluminum oxide, whereby the titanium carbide intermediate layer is supposed to be applied at 1000° C. and the second aluminum oxide layer at 1100° C. by the CVD process. As stated particularly in DE 28 25 009, column 2, lines 28 and following, hard, polycrystalline and compact $\alpha$-aluminum oxide layers should normally be produced only at deposition temperatures above 950° C. According to the state of the art, at lower deposition temperatures loose and powdery deposits are formed, consisting mostly of the $\gamma$-modification and/or the $\Delta$-modification of aluminum oxide. However, at deposition temperatures of approximately 1000° C. and above the aluminum oxide phase is normally the $\gamma$-modification, considered suitable for the coating of tools. In order to avoid the danger of multiphase aluminum oxide coatings, which supposedly occur at deposition temperatures below 1000° C. and which show a considerable mechanical weakness causing premature tool failure, it is proposed that the aluminum oxide coating should consist of at least 85% of the $\gamma$-modification and that optionally a balance consisting of the $\alpha$-modification form zones or spots of a magnitude of maximum 10µm on the surface. For the deposition the CVD process at temperature of approximately 1000° C. is proposed.

In order to avoid the problems arising at high deposition temperatures, the German Patent Document DE 32 34 943 describes the deposition of an amorphous aluminum oxide layer. However, thorough tests performed with amorphous aluminum oxide layers deposited by the PVD process have shown that purely amorphous aluminum oxide layers have a glass-like breaking behavior and therefore cannot yield any significant improvements of the wear factor. In interrupted cutting operations these layers have a tendency to crack.

The German Paten Document DE 24 28 530 A1 proposes a method for the protection against corrosion and wear of a metal part which contains at least one element of the Group I B of the periodic table of elements in pure or alloyed state, and wherein on the surface of this part a layer of amorphous and transparent aluminum oxide is applied through chemical deposition from the vapor phase. However, amorphous layers applied at temperatures between 300° and 800° C. are far less stable against thermal influences than for instance the modification of the aluminum oxide ($\alpha$-$Al_2O_3$) known as corundum.

It is basically also known to use aluminum oxide layers as protective coatings against hot gas corrosion, e.g. in internal combustion engines. In this case special requirements have to be met not only relating to the mechanical stability of the coating, but also relating to the sealing characteristics of the coating. Layers consisting totally or partially of $\gamma$-$Al_2O_3$ undergo at high temperatures a conversion into $\alpha$-$Al_2O_3$, whereby fissures occur. Therefore they are not suited as protective layers against hot gas corrosion. According to the state of the art, this can be achieved only by comparatively thick (approximately 500 µm) ceramic layers applied by thermal spraying.

OBJECT OF THE INVENTION

It is therefore the object of the present invention to improve the aforementioned composite body with regard to the protective action and the mechanical wear characteristics of the $\alpha$-aluminum oxide layer.

SUMMARY OF THE INVENTION

This object is attained in a composite body consisting of a hard metal, steel or cermet substrate body or a substrate body made of a nickel-based or cobalt-based alloy and several surface layers, of which at least one, preferably the outer layer, consists of $\alpha$-$Al_2O_3$. According to the invention the $\alpha$-$Al_2O_3$ layer has a fine-crystalline structure the diffraction lines of which when measured by the half-width values with CuK $\alpha$-X-rays have half-width values at least three times greater than those of a powdered compact body of $\alpha$-$Al_2O_3$ or of an $\alpha$-$Al_2O_3$ layer produced through a CVD process at 1000° C. to 1100° C. A measure for the crystal size of the polycrystalline $\alpha$-aluminum oxide structure is given by the X-ray diffraction diagram. In the case of the used CuK $\alpha$-radiation, at the same angle position 2θ of the registering counting tube and at the same aperture of the ray collimator, the line width of the interference lines are smaller the larger the interfering monocrystalline crystallites are or the larger the average granular size of the polycrystalline materials (here $\alpha$-aluminum oxide). This correlation is described by the formula derived by W. Scherrer $B_{1/2}$=k · $\lambda/(<d> \cdot \cos \theta)$. $\lambda$ s the wavelength of the X-ray, $<d>$ the average linear extent of the reflecting crystallite, θ is the glancing angle and k is a constant. The line width of the X-ray diffraction diagram can thus be used as a very accessible measure for the average granular size, particularly in the case of very fine submicroscopic crystals. As a comparison we use the half-width of the diffraction lines measured with the same X-ray beam during the testing of a powdery body of $\alpha Al_2O_3$ or of an $\alpha Al_2O_3$ layer applied by means of a CVD process at 1000° C. to 1100° C.

Preferably the basis of this measurement is the X-ray diffraction line indexed by the Millerian indices (113) and occurring at the diffraction angle of 43.4° of the 2θ —scale in a CuK α—X-ray beam, whose half-width value, preferably at least four times the half-width value of the corresponding X-ray diffraction line of the powdery aluminum oxide is taken as a basis for the granular fineness of the hexagonal, close-packed crystalline structure of the aluminum oxide.

According to a feature of the invention, the thickness of the aluminum oxide coating should be 1 to 12 μm, preferably between 2 to 6 μm.

According to a further embodiment of the invention, the aluminum oxide coating consists of 49 to 52.5% by weight mass aluminum, 46 to 47.5% by weight oxygen and 0.5 to 3.5% by weight chlorine.

Depending on intended use, also composite bodies with at least one intermediate layer of carbides, carbonitrides, nitrides, borides and/or oxides of elements of the Groups IVa to VIa of the periodic table of elements, have proven to be advantageous. Specifically, multilayered coatings of titanium carbide, titanium nitride and aluminum oxide are appropriate.

The composite bodies of the invention with protective layers of fine-crystalline α-$Al_2O_3$ have characteristics which exceed the test results of the state of the art, particularly the hard metal or cermet substrate bodies with one or more surface layers have excellent cutting capability. However, when compared to the state of the art, even protective layers whose coating consists only partially of fine-crystalline α-$Al_2O_3$ and for the rest of amorphous $Al_2O_3$ or of $Al_2O_3$ with nanocrystalline structure fractions can still have considerably improved usage characteristics.

Nanocrystalline structure fractions have crystallites of only a few nanometers and cannot produce clearly defined X-ray interferences because of their small size.

Therefore in a further embodiment of the invention it is proposed to use coatings consisting partially of fine-crystalline α-$Al_2O_3$ and/or nanocrystalline $Al_2O_3$, with the balance being amorphous $Al_2O_3$. Protective coatings consisting only of amorphous $Al_2O_3$ have however proven to be useless, since these coatings were very rough and tended to break or chip under thermal or mechanical load, particularly when used in cutting tools.

In an amorphous material there is no long range order or periodicity in the spatial arrangement of atoms. The proof of whether a coating is compact grained and/or nanocrystalline or completely amorphous can also be found through examination with an electron microscope. In the case of fine-crystalline structures or of nanocrystalline structures, interference patterns (Debye-Scherrer-rings) can be found which can be unequivocally assigned to certain planes of the corresponding crystal phases.

The composite body of the invention can be put to use for various technical purposes. Especially composite bodies with a hard metal or cermet substrate body are preferably used as cutting materials for machining, particularly in the form of indexable inserts. A further use is based on the sealing properties and the oxidation resistance of the protective coating. Since the coatings produced according to the process of the invention present compressive strain, the coating remains tight even at high temperatures and the thereby generated expansion of the basic body, i.e. there are no breaks. For this reason the protective coating is exceedingly well suited for the lining of combustion chambers or for the protection of movable parts in combustion chambers, particularly in the case of composite bodies whose substrate bodies are made of steel or a nickel or cobalt based alloy.

Surprisingly it has further been found that the protective coatings of the invention have excellent adhesion properties when applied to metallic materials, particularly steel materials. Since aluminum oxide has a very low friction coefficient when applied to steel as a counterbody, the protective coating of the invention can also be applied for friction reduction and wear reduction of frictionally connected parts, such as camshafts.

The excellent adhesion capability can be used also for the improvement of other layers of hard material. So, for instance, the layer applied immediately to the substrate body can consist of aluminum oxide and the outer layer of titanium nitride, whereby the aluminum oxide has good adhesion with respect to the titanium nitride.

According to the invention, for the production of the fine-crystalline α-aluminum oxide coating a plasma-activated CVD process at temperatures of 400° to 750° C. is used. The plasma activation is caused by a direct voltage at the substrate body serving as a cathode. The low coating temperatures due to the selection of the plasma-activated CVD process lead to an improved adhesion aluminum oxide surface layer. Except for the support points, the substrate body is completely and evenly covered by the layer, without the shading effects occurring normally in the PVD process However, the coating is performed preferably at temperatures between 450° and 650° C. The pulsed direct voltage has maximal values between 200 and 900 V.

The coating quality is further improved due to the fact that between the negative direct voltage pulses (rectangular pulses) during the pulse pauses a residual direct voltage is maintained, which is higher than the lowest ionization potential of the gas molecules participating in the CVD process, but not higher than 50% of the maximal value of the direct voltage. What counts mainly is not the voltage curve, or the uniformity of the residual direct voltage, but rather the fact that during the entire interval between two rectangular pulses the residual direct voltage is always higher than the mentioned ionization potential. In the following several decisive ionization potentials for the CVD process of aluminum oxide are indicated:

H: 13.5 eV, Ha: 15.8 eV,

Ar: 15.7 eV,

O: 13.6 eV, $O_2$: 12.1 eV, $AlCl_3$: 11.0 eV.

According to a further development of the invention the ratio of the residual direct voltage to the maximal value of the pulsed direct voltage ranges between 0.02 and 0.5.

The period duration of the pulsed direct voltage should preferably range between 20 μs and 20 ms, whereby the period duration is defined by the duration of a rectangular pulse and a pulse pause. Preferably the ratio of the pulse duration to the period duration is selected between 0.1 to 0.6. The parameters are finally set so that a layer growth speed of 0.5 to 10 μm/h is reached.

The described process for aluminum oxide coating has already been described in DE 38 41 730 A1 and it can also be used for producing a coating of various other hard materials, such as carbides, nitrides, borides, silicides and oxides with a particularly high hardness and a high melting point, such as for instance titanium carbide, titanium nitride, titanium carbonitride, zirconium oxide, boron carbide, silica carbide and titanium boride. However it is surprising that, contrary to the suspicions expressed in the state of the art literature, the protective layer has an unexpectedly finecrystalline α-aluminum oxide modification without further crystalline phases.

Preferably as a hard-substance creating reactive gas atmosphere, aluminum chloride, carbon dioxide and hydrogen partially ionized by a corona discharge is used. As a preferred gas pressure during coating a pressure of 200 to 300 pascals was selected.

BRIEF DESCRIPTION OF THE DRAWINGS

The above and other objects, features, and advantages will become more readily apparent from the following description, reference being made to the accompanying drawing in which:

FIGS. 4a and 4b are graphs showing the cratering depth KT and the cutting edge wear VB depending on the milling path $l_f$ on the workpiece material 42CrMo4V;

SPECIFIC DESCRIPTION

Figure 1A:
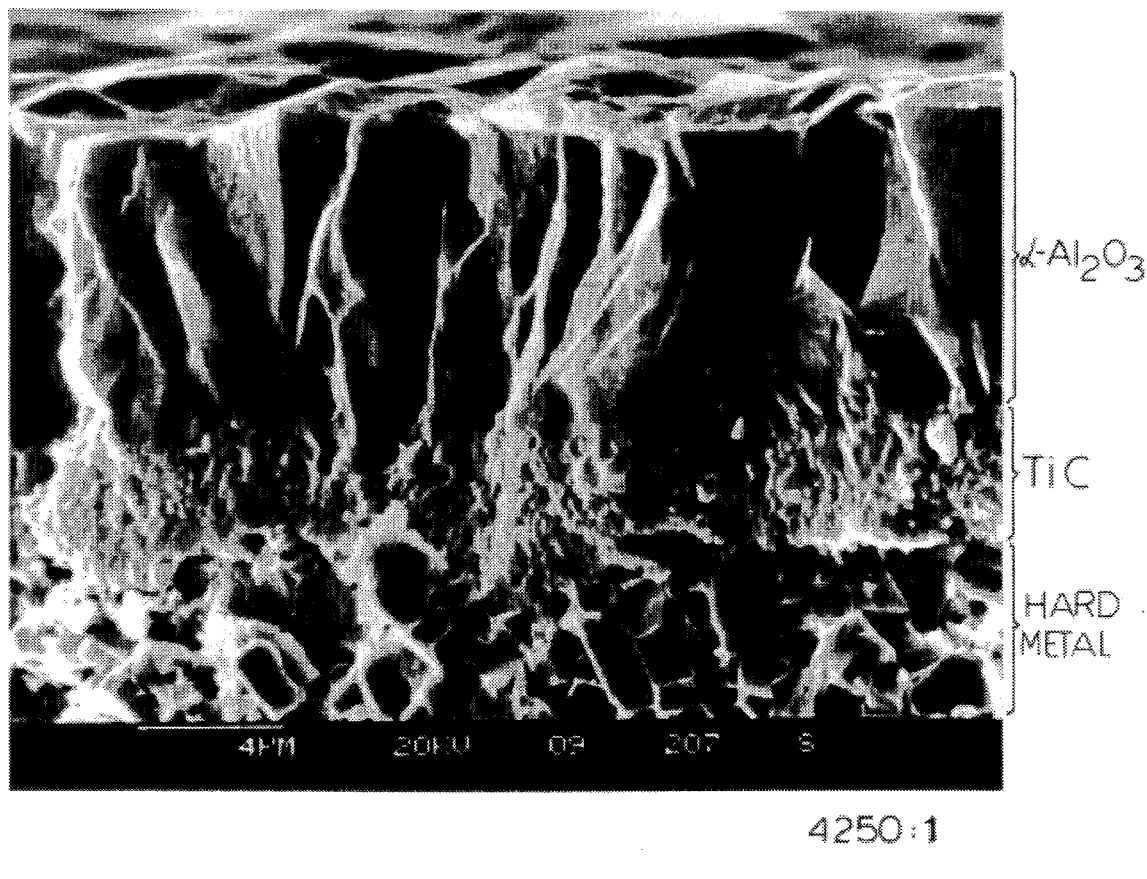
FIG. 1a is a microphotograph of the structure of the coating of an indexable insert according to the state of the art coated with TiC and α-$Al_2O_3$, scanning electron microscope photo, enlargement 4250:1.
Figure 1B:
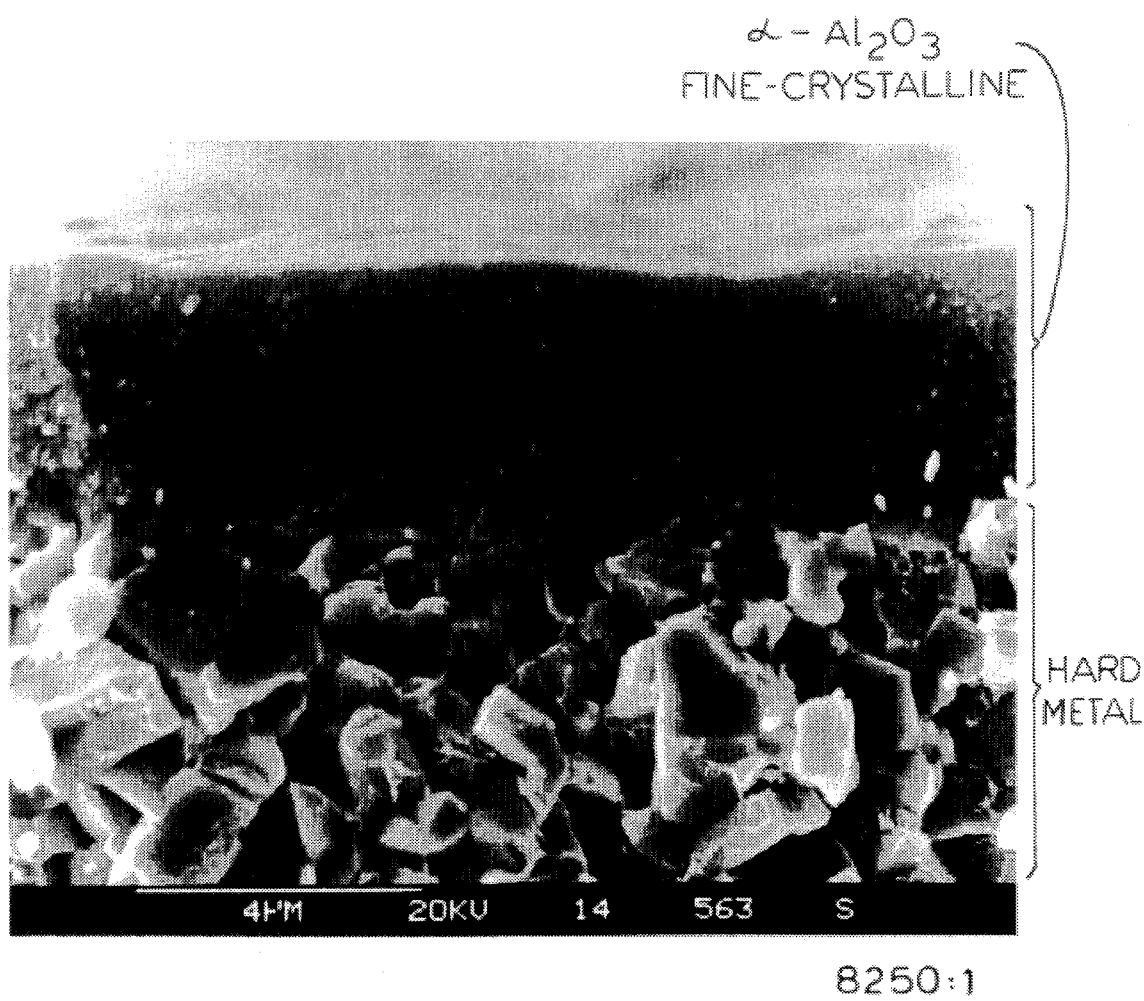
FIG. 1b is a micrograph of the structure of a coating of an indexable insert according to the invention coated with fine-crystalline α-$Al_2O_3$, scanning electron microscope photo, enlargement 8250:1.

The deposited α-aluminum oxide has a very fine granular structure. Through examination with a scanning electron microscope the difference between this structure when compared to the known aluminum oxide coating, produced by the CVD process at approximately 1000° C. can be easily established. The images in FIG. 1a and 1b show the structures occurring at breaking in of an indexable insert coated according to the state of the art with TiC and α-aluminum oxide (FIG. 1a) and an indexable insert according to the invention (FIG. 1b). The considerably finer crystal structure of the layer is easily discernible.

Figure 2A:
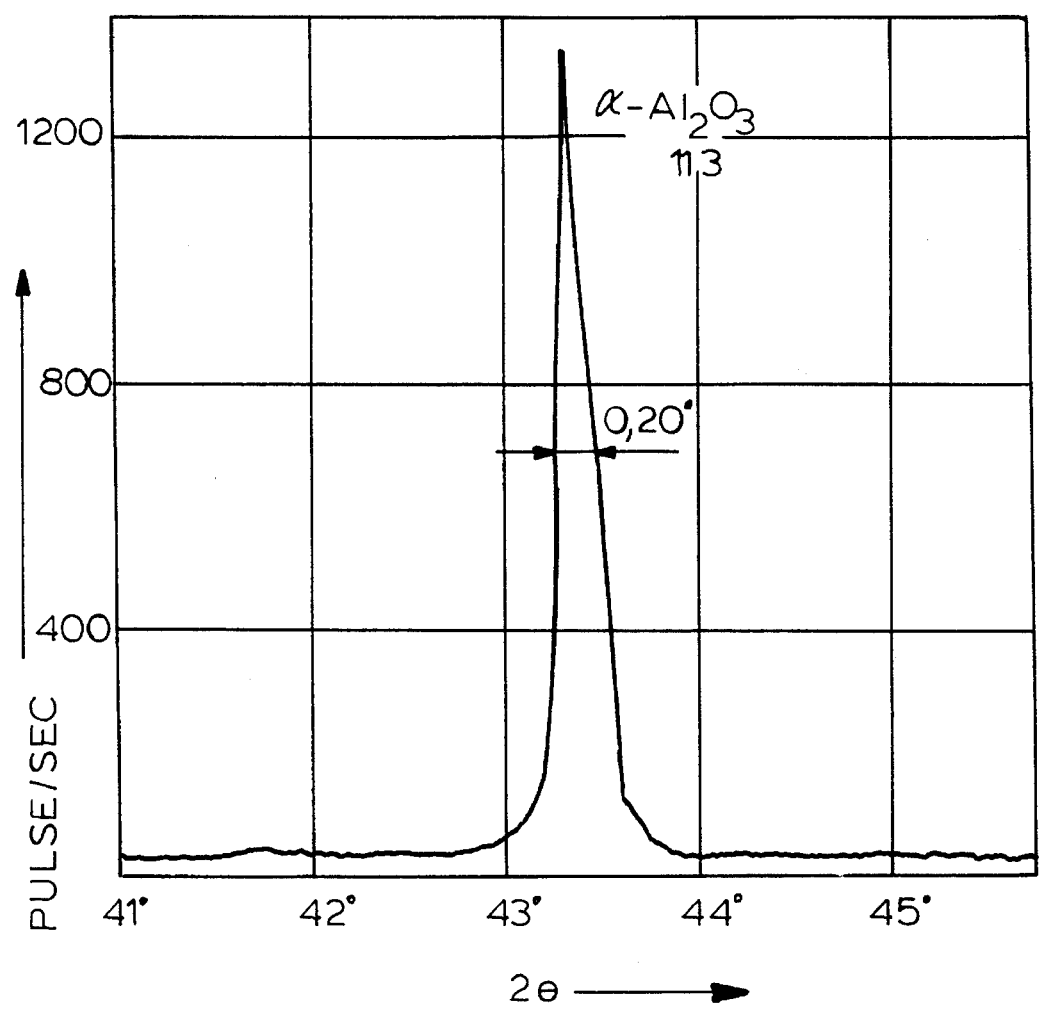
FIG. 2a is a graph of the line profile of a compact aluminum oxide test as known to the state of the art.
Figure 2B:
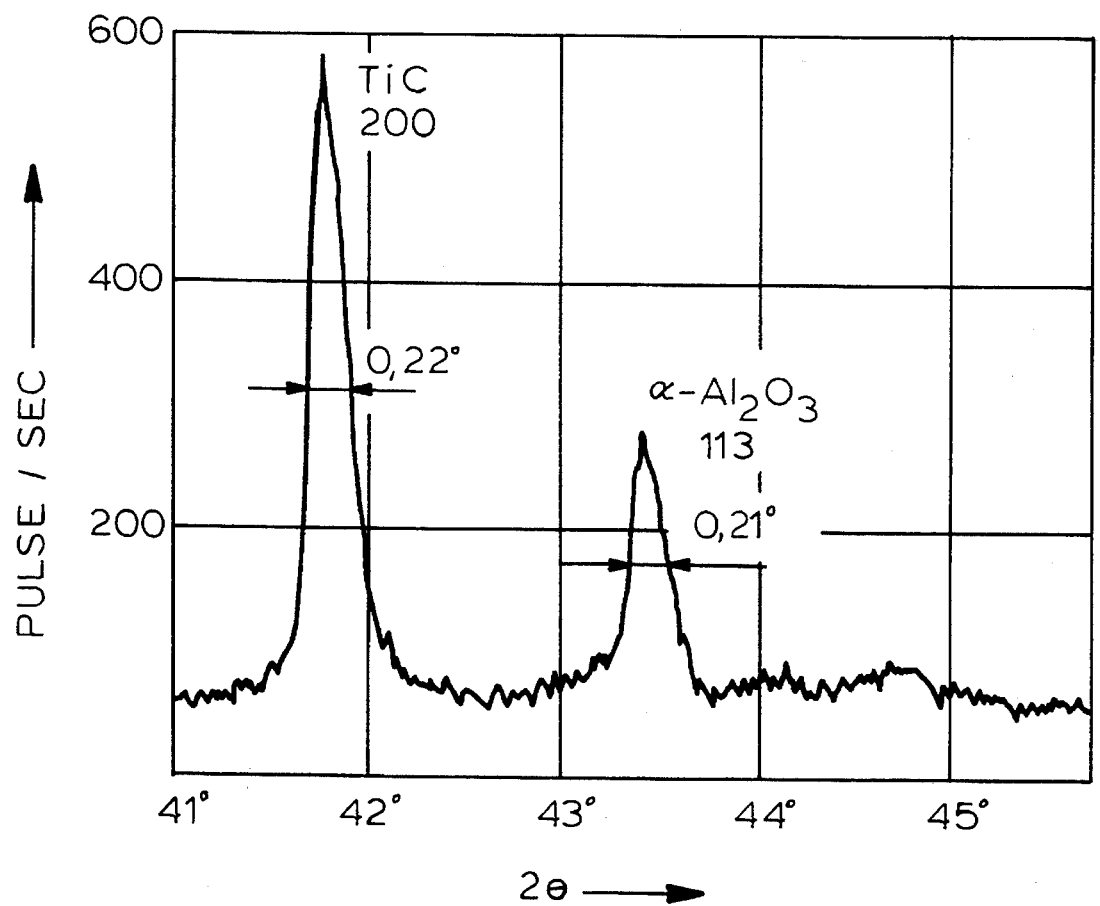
FIG. 2b is a graph of the line profile of an e aluminum oxide layer deposited by the CVD process at approximately 1000° C. on a hard metal substrate previously coated with titanium carbide.
Figure 2C:
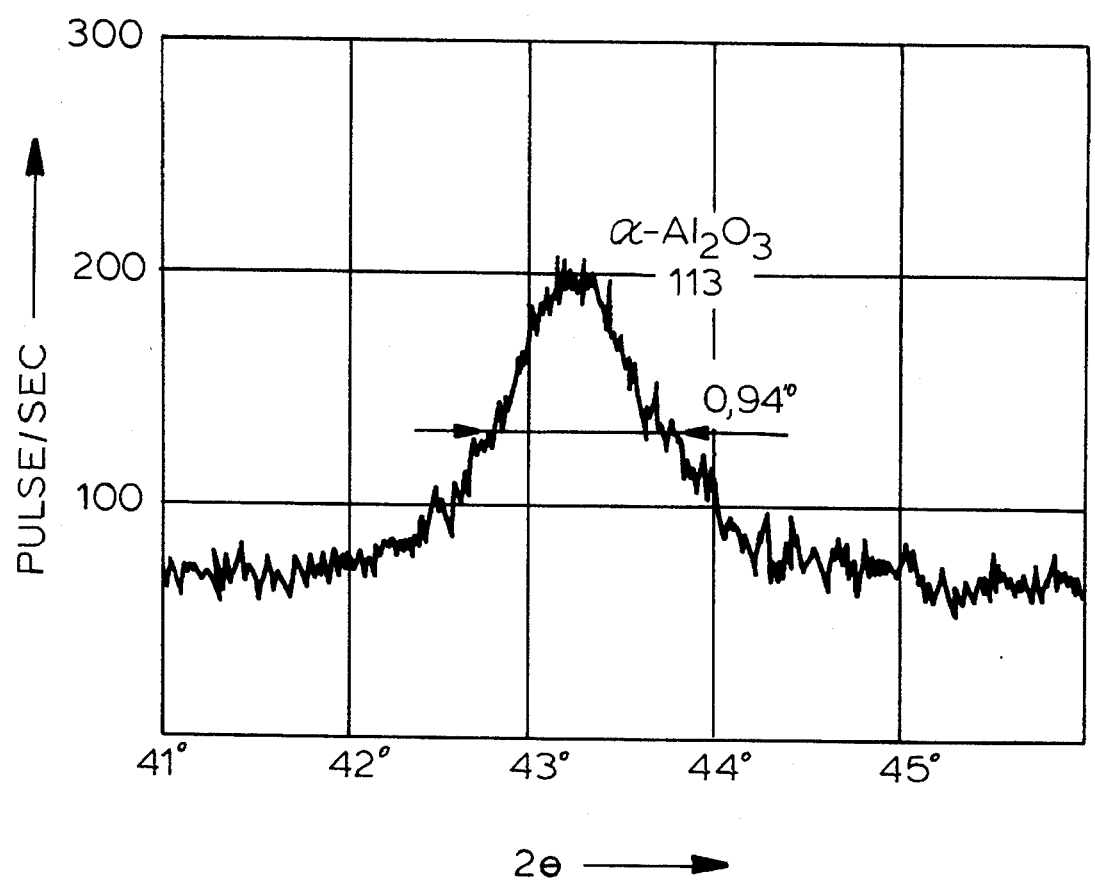
FIG. 2c is a graph of the line profile of the α-aluminum oxide coating according to the invention.

The explanations regarding FIGS. 2a to 2c have to be preceded by the remark that any crystalline structure, such as α-$Al_2O_3$ or γ-$Al_2O_3$, at certain diffraction angles 2θ shows the interference lines defined by the so-called Millerian indices. For instance in the case of α-$Al_2O_3$ at different diffraction angles 2θ as is the case of α-$Al_2O_3$, respective interference lines representing the specific structures appear, so that an X-ray diffraction diagram can be considered as a kind of fingerprint for the identification of crystalline structures and the modifications of solid matter.

As already mentioned before, the half-widths values are directly proportional to the average size of the reflecting crystals.

FIG. 2a shows a portion of the line profile of a compact aluminum oxide body. The half-width of the (113) reflex equals 0.2° of the 2θ scale with the use of CuK α radiation.

By comparison, FIG. 2b shows the line profile of a layer of α-aluminum oxide deposited by a CVD process at approximately 1000° C. onto a hard metal substrate previously coated with a layer of titanium carbide. In addition to the typical α-aluminum oxide line characterized by the (113) reflex, the diffraction line of the (200) reflex typical of titanium carbide can also be seen. As clarified in FIG. 2b, the half-width value of the α-aluminum oxide line equals 0.21° of the 2θ scale and (within the framework of the measuring accuracy) is equivalent to the half-width value recognizable in FIG. 2a. This makes clear that the average grain size of the α-aluminum oxide deposited by using the CVD process at 1000° C. is practically identical with the grain size of the compact e aluminum oxide sample according to FIG. 2a. On the contrary, the half-width value of the α-$Al_2O_3$ line of the (113) reflex of a sample produced according to the invention equals 0.94° of the 2θ scale (see FIG. 2c). Therefore composite bodies with a fine-crystalline α-$Al_2O_3$ coating according to the invention have a line width which is at least threefold, in the present case at least fivefold the natural line width occurring in the compact body (see FIG. 2a).

The cutting bodies equipped with the aluminum oxide coating according to the invention have an extraordinarily long tool life and durability, exceeding by far the present state of the art, which can be clearly seen from the following example:

Of a hard metal of the machining application class M25 (according to DIN-Norm 4990), 1000 indexable inserts of the geometric shape SEKN1203AFN (defined according to DIN 4987) have been produced. Fractions of this production batch have each been coated by separate methods, as can be seen from the following Table 1.

TABLE 1

| Execution | Process | Coating temperature | Coating Substance | Layer thickness |
|---|---|---|---|---|
| 1 | CVD | 1000° C. | TiC + α – $Al_2O_3$ | 2 + 6 μm |
| 2 | PVD | 500° C. | (Ti,Al)N | 6 μm |
| 3 | PCVD | 550° C. | TiN | 5 μm |
| 4 | PCVD | 600° C. | α – $Al_2O_3$ | 5 μm |

In the Example 1, indexable inserts were produced according to CVD process described in German Patent 22 33 700. In order to achieve a good adherence of the aluminum oxide layer to the indexable insert, as disclosed in DE 22 53 745 A1 prior to the application of the aluminum oxide layer, an intermediate titanium carbide layer of a thickness of 2 μm also deposited by CVD was applied to the hard metal body.

According to Example 2 a target of a titanium-aluminum alloy was pulverized in high vacuum under a partial pressure of approximately 0.1 pascal of nitrogen. The used PVD process and the wear protection coating, respectively coatings of the hard substance (Ti, Al) produced by it have proven themselves in the past.

The same applies to Example 3, wherein layers of the hard substance TiN applied through a plasma-activated CVD process have been selected.

The embodiment of the invention (Example 4) is a coated hard metal body, whose layer of α-aluminum oxide of 5 μm has been produced through a CVD process at 600° C., whose hard-substance generating reactive gas atmosphere, consisting of aluminum chloride, carbon dioxide and hydrogen, was partially ionized by a corona discharge (plasma activation). The coating took place directly onto the hard metal body at a coating temperature of 600° C. and a gas pressure of 250 Pa. The result was an approximately 5 μm thick coating with good adherence on an indexable insert, whose X-ray diffraction test showed that the fine-grained structure of α-aluminum oxide of the invention was present in the layer. The half-width value of the (113) line was approximately five times greater than the above-defined natural half-width value of a compact aluminum oxide body.

Figure 3A:
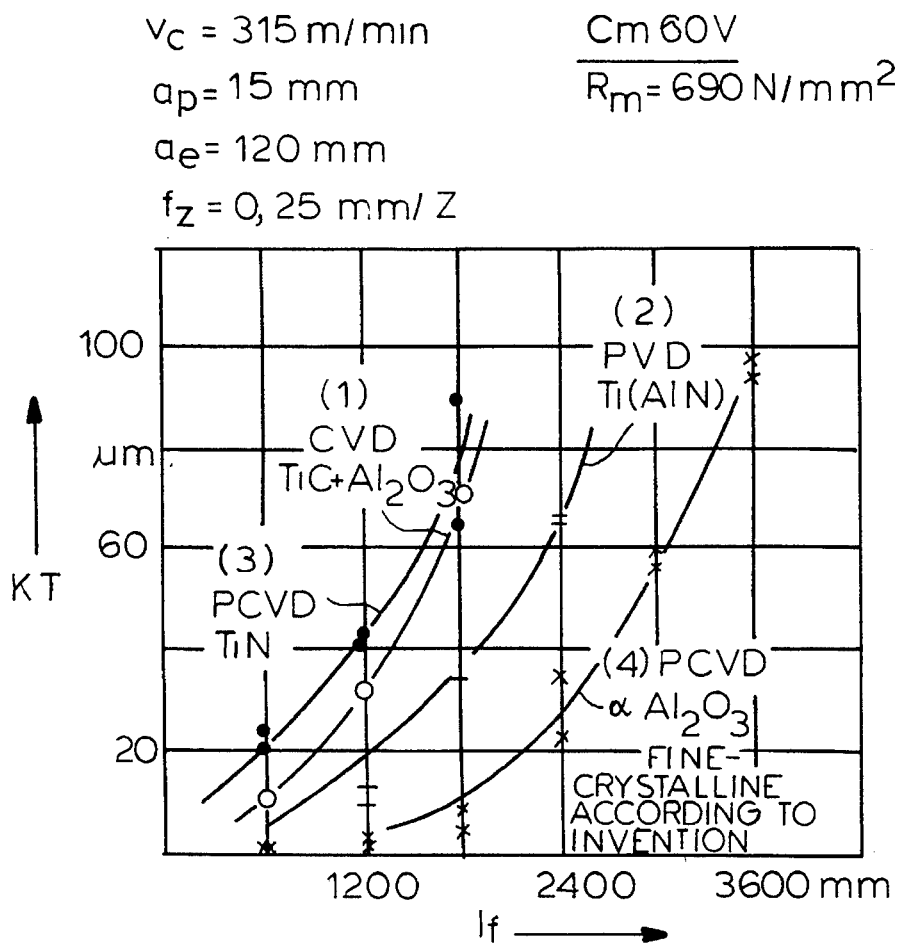
FIGS. 3a and 3b are graphs showing the depth of cratering KT and the cutting edge wear VB depending on the milling path $l_f$ on the workpiece material Cm 60 V.
Figure 3B:
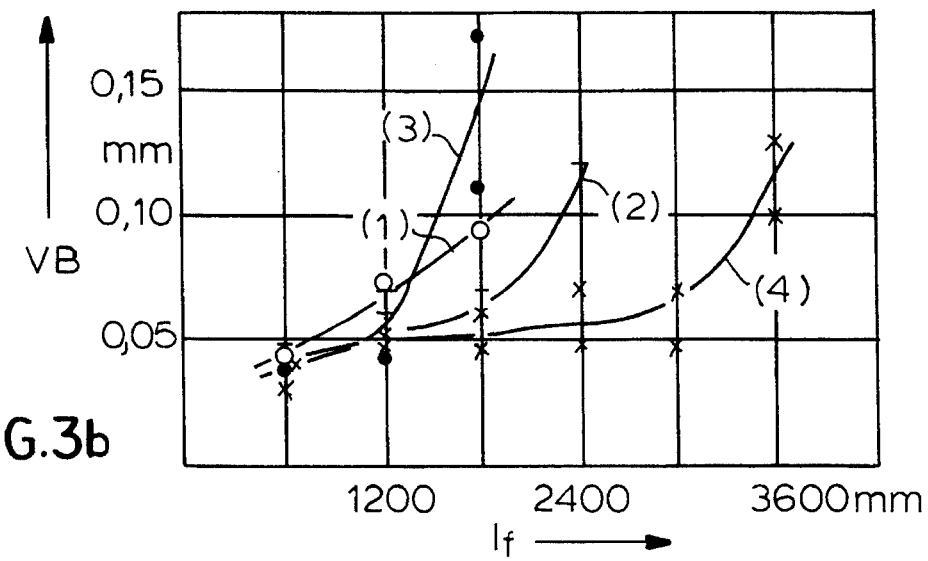

The four embodiments of the indexable inserts shown in Table 1 were tested under constant conditions in a milling machine. For this purpose a front milling head was fitted with each of the indexable inserts and a steel block 120 mm wide and 600 mm long of the steel Cm60V (Rm 690 N.mm$^2$) was machined. The cutting depth equaled 1.5 mm and the advance was 0.25 mm/tooth. A comparatively high cutting speed of 315 m/min was selected. Each time after the entire length of the steel block was machined, the wear of the indexable insert was determined by measuring microscopes. The depth of the craters (KT) forming on the face and the width of the wear measured on the free surface (VB) have been taken as a measure for the wear. A comprehensive representation of the measurement results can be seen in FIGS. 3a and 3b. The representation shows that with the fine-crystalline coating of α-$Al_2O_3$ of the invention according to Example 4 (see Table 1) it is possible to remove an amount of material approximately double compared to the "normal-grained" α-$Al_2O_3$ coating according to Example 1. Also when compared to the coatings applied at temperatures of 500° C., respectively 550° C. according to Examples 2 and 3, the coating of the invention shows a higher cutting efficiency.

In a further test the indexable inserts of Table 1 were tested in the machining of another material, namely the alloy steel 42CrMo4V (Rm 840 N/mm$^2$).

Except for the dimensions of the workpiece (length of the block 400 mm), all parameters were the same as in the previous. The results are shown in FIGS. 4a and 4b. Here too the superior efficiency of the indexable insert with the coating of fine-crystalline α-$Al_2O_3$ according to the invention is proven.

Figure 5:
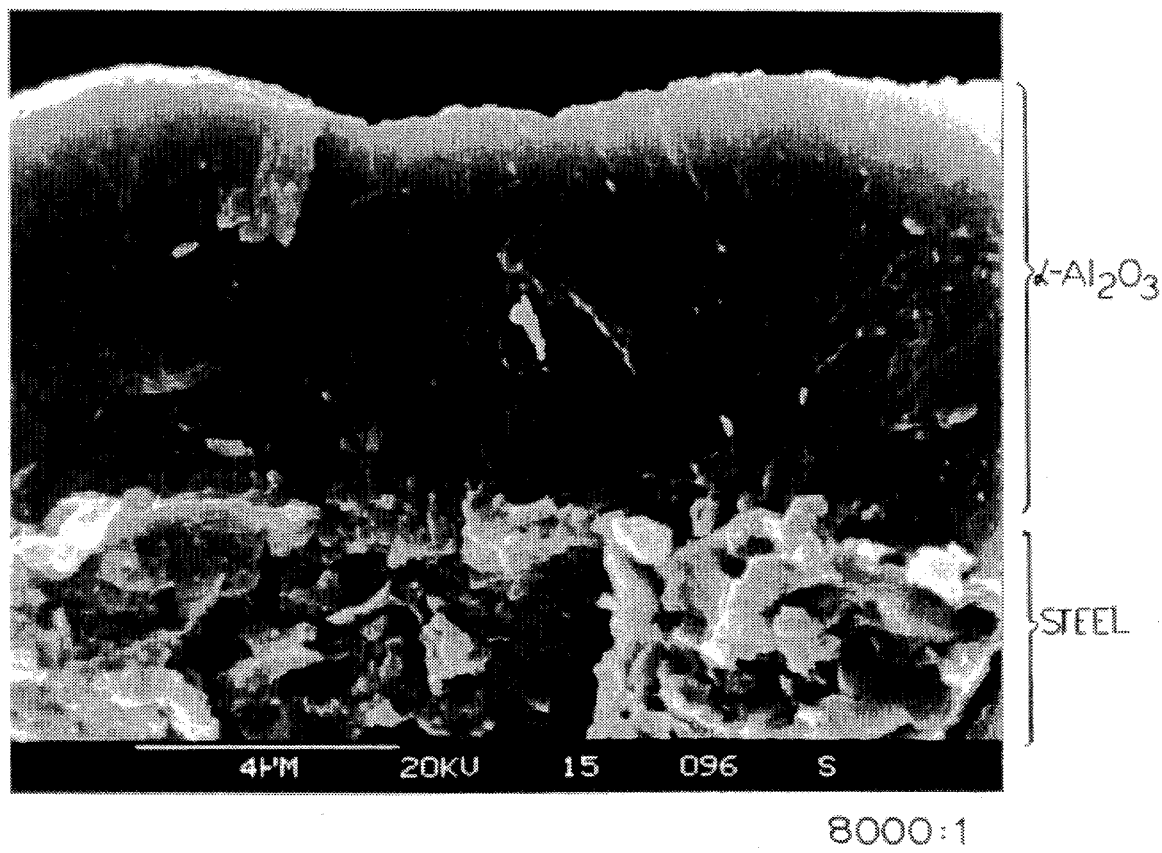
FIG. 5 is a photomicrograph of the structure of the coating of a steel body coated with the fine-crystalline α-$Al_2O_3$ according to the invention, scanning electron microscope photo, enlargement 8000:1.

The α-aluminum oxide according to FIG. 5 deposited onto a steel body shows a fine grained structure. The protective coating has a very fine structure, free of pores and cracks.

Figure 6:
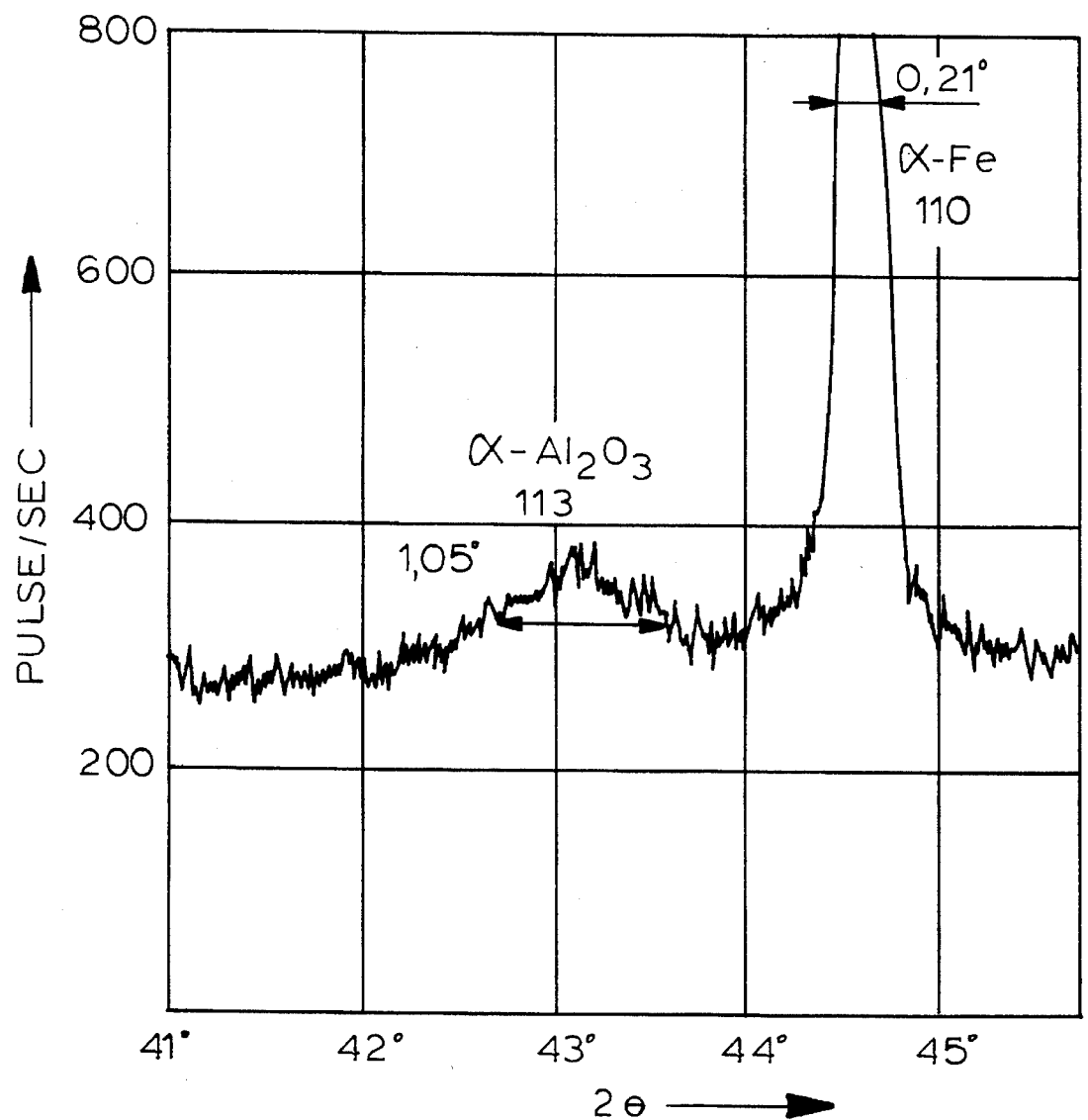
FIG. 6 is a graph of the line profile of the α-aluminum oxide protective coating according to the invention on a steel substrate.

FIG. 6 shows a portion of a line profile of a compact steel substrate body with an aluminum oxide protective coating. The half-width values of the (113) reflex equals 1.05° on the 2θ scale. Thus composite bodies consisting of a substrate steel body with the fine-crystalline coating of α-$Al_2O_3$ of the invention have a line width which is threefold, in the present case fivefold of the natural line width occurring in compact bodies (see FIG. 2a).

The tests have proven that the resistance of metallic materials against hot corrosion can be considerably improved by applying the protective layer of the invention. So for instance sheet metal made of heat-resistant steel 1.4712 provided with the protective coating of the invention, when subjected to an oxidizing atmosphere at 1200° C. for an exposure time of 24 hours, has shown no visible or measurable changes, while uncoated sheet metal showed considerable scaling.

It has been found that the protective layers can be applied with excellent adhesion onto the so-called superalloys (nickel-based alloys and cobalt-based alloys). After a 24 hour exposure at 1200° C. the layers showed no reduction in their adhesion strength.

In order to test the frictional characteristics of the protective layer, two outer rings of a ball bearing made of steel 1.3505 (100Cr6) of an external diameter of 68 mm were frontally ground and polished and one of the two rings was provided with a protective coating according to the invention. In a device the two rings were mounted on a vertical axle, so that the polished or coated side of the ring assumed a horizontal position. A stationary steel sphere of 4 mm in diameter was placed on the polished or coated surface of the ring and set under a load of 50 N. After that the rings were rotated at a speed of 300 rotations per minute. After 120 minutes of testing the friction track was tested with a measuring instrument in order to determine the surface roughness. While the uncoated test body showed a clear depression in the friction track (approximately 2 to 3 μm), in the friction track of the coated body no abrasions could be found.

The protective coating according to the invention was also tested with titanium nitride for its suitability as an adhesion-improving intermediate layer in the coating of tool steel (rapid machining steel 1.3343) with titanium nitride. It has been proved that the adhesion strength of an outer titanium nitride layer of approximately 5 μm could be considerably enhanced by an intermediate layer of the fine-crystalline aluminum oxide of the invention having a thickness of approximately 1 to 2 μm. This was tested by an apparatus wherein a conical diamond point with a 0.1 mm rounding radius was guided with increasing contact pressure over the coated surface. While a titanium nitride layer applied according to the state of the art showed chipping effects under a load of 400 N, this chipping effect could be found only at a load of 900 N with the intermediate layer according to the invention.

Finally the action of the protective layer was tested with respect to improvement of the tool life of spiral drills. It is known that the tool life of drills made of rapid machining steel can be considerably improved by applying a titanium nitride coating. Therefore drills of 6 mm in diameter, coated with titanium nitride through a PVD process have been selected as the subjects of comparative tests. In the tests finished, polished but uncoated drills were provided with an approximately 2 μm thick protection coating according to the invention. With this drills, as well as with the titanium-nitride coated drills holes were drilled in a plate made of steel 1.7225 (42CrMo4). While the titanium-nitride coated drill could drill 250 holes before becoming blunt, the corresponding number of holes drilled with the drill coated according to the invention reached 550.

We claim:

1. A composite body, comprising:
   a substrate body selected from the group which consists of a hard metal body, a steel body, a cermet body, a nickel alloy body and a cobalt alloy body, wherein said substrate body is provided with
   at least one fine-crystalline α-$Al_2O_3$ layer deposited thereon by plasma-activated chemical vapor deposition at a temperature of 400° to 750° C. with plasma activation by pulsed direct voltage with said substrate body connected as a cathode, said fine-crystalline α-Al$_2$O$_3$ layer having a diffraction line upon X-ray diffraction analysis with CuK$_\alpha$ X-rays with a half-width value at least three times greater than a half-width value of a corresponding line measured on a powdered compact body of α-Al$_2$O$_3$ and an α-Al$_2$O$_3$ deposited by chemical vapor deposition at 1000° to 1100° C.

2. The composite body defined in claim 1 wherein said diffraction line is a diffraction line indexed by Millerian indices at (113) and appearing at a diffraction angle of 43.4° of a 2θ scale with CuKα X-ray diffraction characteristic.

3. The composite body defined in claim 1 wherein the thickness of said fine-crystalline α-Al$_2$O$_3$ layer is 1 to 13 μm.

4. The composite body defined in claim 3 wherein said thickness is 2 to 6 μm.

5. The composite body defined in claim 1 wherein said fine-crystalline α-Al$_2$O$_3$ layer consists of 40–52.5% by weight aluminum, 46–47.5% by weight oxygen and 0.5 to 3.5% by weight chlorine.

6. The composite body defined in claim 1 wherein said fine-crystalline α-Al$_2$O$_3$ layer contains at least one compound selected from the group which consists of nanocrystalline Al$_2$O$_3$ and amorphous Al$_2$O$_3$.

7. The composite body defined in claim 1 wherein said fine-crystalline α-Al$_2$O$_3$ layer is applied directly to a substrate body selected from the group which consists of a hard metal body, a cermet body, a nickel alloy body and a cobalt alloy body.

8. The composite body defined in claim 1 wherein at least one layer of a material selected from the group which consists of a carbide, carbonitride, nitride, boride and oxide of an element from group IV to group VI of the Periodic Table is also deposited on the substrate body.

9. The composite body defined in claim 8 wherein said fine-crystalline α-Al$_2$O$_3$ layer is provided on at least one layer of said material.

10. The composite body defined in claim 9 wherein said fine-crystalline α-Al$_2$O$_3$ layer is applied to at least one layer of said material selected from the group which consists of a titanium carbide layer and a titanium nitride layer.

11. A method of protecting a surface selected from the group which consists of a surface of a cutting tool, a surface of a combustion chamber, a surface of a body in frictional contact with another body and a surface of a casting mold which comprises applying to said surface at least one finecrystalline α-Al$_2$O$_3$ layer on said substrate by plasma-activated chemical vapor deposition at a temperature of 400° to 750° C. with plasma activation by pulsed direct voltage with said substrate connected as a cathode, so that said fine-crystalline α-Al$_2$O$_3$ layer has a diffraction line upon X-ray diffraction analysis with CuKα X-rays with a half-width value at least three times greater than a half-width value of a corresponding line measured on a powdered compact body of α-Al$_2$O$_3$ and an α-Al$_2$O$_3$ deposited by chemical vapor deposition at 1000° to 1100° C.

12. The process defined in claim 11 further comprising maintaining a gas pressure during the plasma-activated chemical vapor deposition between 100 and 400 Pa.

13. A process for applying a surface coating of fine-crystalline α-Al$_2$O$_3$ on a substrate body selected from the group which consists of a hard metal body, a steel body, a cermet body, a nickel alloy body and a cobalt alloy body, comprising depositing at least one fine-crystalline α-Al$_2$O$_3$ layer on said substrate by plasma-activated chemical vapor deposition at a temperature of 400° to 750° C. with plasma activation by pulsed direct voltage with said substrate connected as a cathode, so that said finecrystalline α-Al$_2$O$_3$ layer has a diffraction line upon X-ray diffraction analysis with CuK$_\alpha$ X-rays with a half-width value at least three times greater than a half-width value of a corresponding line measured on a powdered compact body of α-Al$_2$O$_3$ and an α-Al$_2$O$_3$ deposited by chemical vapor deposition at 1000° to 1100° C.

14. The process defined in claim 13 wherein said temperature is 450° C. to 650° C.

15. The process defined in claim 13 wherein said pulsed direct voltage is between 200 and 900 V.

16. The process defined in claim 13 wherein said pulsed direct voltage comprises negative rectangular direct voltage pulse and pulse pauses with said negative rectangular direct volt pulses, said process further comprising the step of maintaining a residual direct voltage during said pauses which are greater in a lowest ionization voltage of gas molecules participating in said chemical CVD process but which is not higher than the maximum value of said direct voltage pulses.

17. The process defined in claim 16 wherein said residual direct voltage has a ratio to said pulse direct voltage between 0.2 and 0.5.

18. The process defined in claim 16 wherein said pulsed direct voltage has a period of 20 μs to 20 ms.

19. The process defined in claim 16 wherein said pulsed direct voltage consists of pulses of a pulse duration with a ratio of 0.1 to 0.6 to said period.

20. The process defined in claim 16, wherein the speed of growth of said fine-crystalline α-Al$_2$O$_3$ is layer is maintained between 0.5 and 10 μ/h.

21. The process defined in claim 13 wherein said fine-crystalline α-Al$_2$O$_3$ layer is deposited from a reactive gas atmosphere consisting of aluminum chloride, carbon dioxide and hydrogen and partially ionized by a corona discharge.

22. The process for applying a surface coating of fine-crystalline α-Al$_2$O$_3$ on a substrate body defined in claim 13 wherein at least one layer of a material selected from the group which consists of a carbide, carbonitride, nitride, boride and oxide of an element from group IV to group VI of the Periodic Table is also deposited on the substrate body.

\* \* \* \* \*